United States Patent [19]
Luebbe et al.

[11] Patent Number: 4,875,779
[45] Date of Patent: Oct. 24, 1989

[54] LEAD INSPECTION SYSTEM FOR SURFACE-MOUNTED CIRCUIT PACKAGES

[76] Inventors: Richard J. Luebbe, 6179 Paso Los Cerritos, San Jose, Calif. 95120; H. Kenneth Hopkins, 114 Rollingwood Dr., Boulder Creek, Calif. 95006

[21] Appl. No.: 153,764
[22] Filed: Feb. 8, 1988
[51] Int. Cl.[4] .............................................. G01B 11/00
[52] U.S. Cl. .................... 356/394; 356/237; 356/372
[58] Field of Search ............... 356/372, 237, 387, 394, 356/375; 358/101, 106, 107; 250/561, 562

[56] References Cited

U.S. PATENT DOCUMENTS

| | | | |
|---|---|---|---|
| 3,781,467 | 12/1973 | Soames | 178/6.8 |
| 4,520,702 | 6/1985 | Davis et al. | 83/71 |
| 4,549,087 | 10/1985 | Duncen et al. | 250/561 |
| 4,688,939 | 8/1987 | Ray | 356/237 |
| 4,696,047 | 9/1987 | Christian et al. | 382/8 |
| 4,728,195 | 3/1988 | Silver | 356/394 |

FOREIGN PATENT DOCUMENTS

| | | | |
|---|---|---|---|
| 91543 | 5/1986 | Japan | 356/237 |
| 233304 | 10/1986 | Japan | 356/237 |
| 36510 | 2/1987 | Japan | 356/237 |

OTHER PUBLICATIONS

Brochure "Surface Mount Lead Inspection System", Texas Instruments.

*Primary Examiner*—F. L. Evans
*Attorney, Agent, or Firm*—Burns, Doane, Swecker & Mathis

[57] ABSTRACT

An electro-optical system for detecting selected geometrical properties of leads on circuit packages of the surface-mounted type. The system employs a vertically-arranged linear array of photosensitive elements which is carried horizontally parallel to a reference surface and operated to provide a series of one-dimensional scans vertically along the leads.

29 Claims, 1 Drawing Sheet

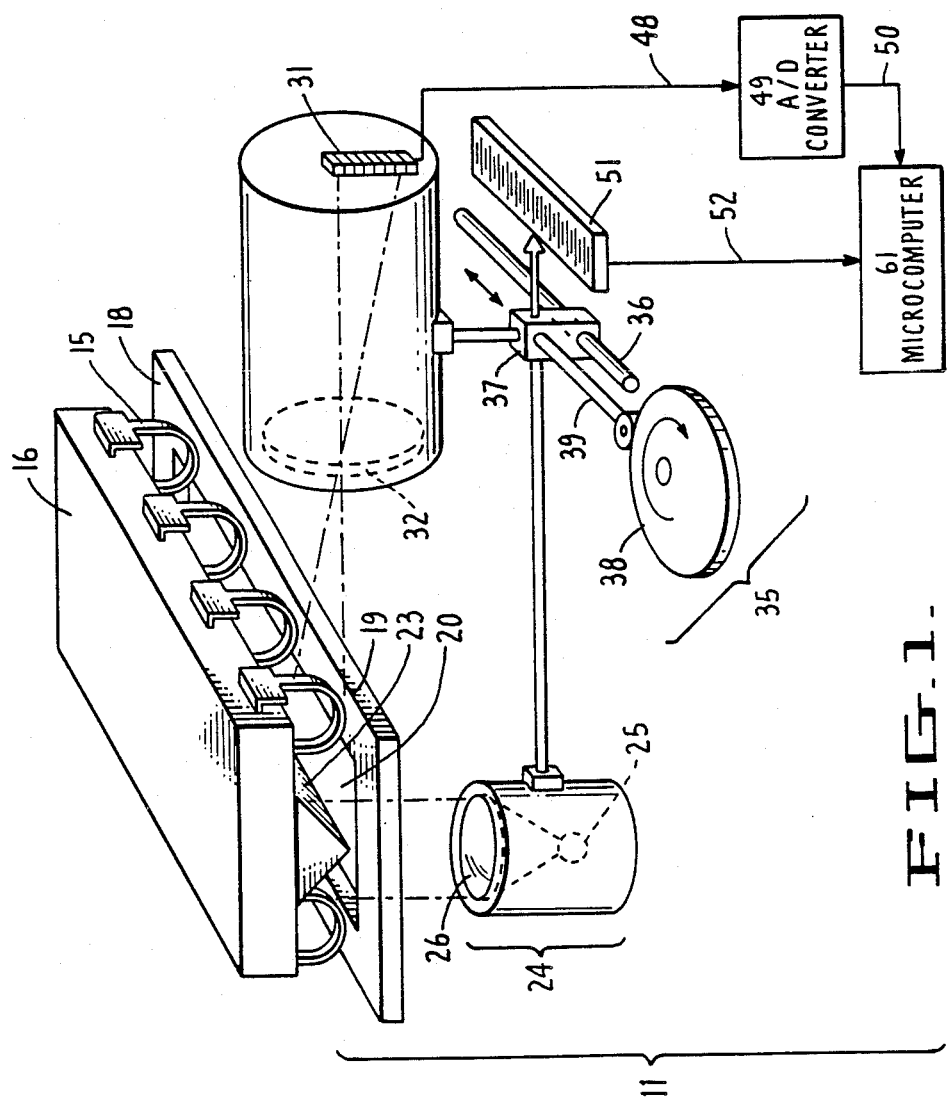

LEAD INSPECTION SYSTEM FOR SURFACE-MOUNTED CIRCUIT PACKAGES

BACKGROUND OF THE INVENTION

1. Field of the Invention

The present invention generally relates to inspection systems for inspecting leads on circuit packages and, more particularly, to systems that inspect the leads on circuit packages of the surface-mounted type.

2. State of the Art

In the assembly of printed circuit boards, the fraction of assembled boards which meet performance specifications is known as the "yield percentage". The goal in most assembly operations is to maximize yield percentage subject to constraints on assembly time. To meet that goal, assembly conditions must be such as to avoid circuit malfunctions on assembled boards.

For assemblies employing integrated circuit packages of the surface-mounted type, circuit malfunctions often can be traced to faulty solder connections between a board and the leads of a circuit package mounted on the board. Typically, leads on circuit packages of the surface-mounted type are finer and more closely spaced than leads on circuit packages of the dual in-line pin (DIP) type. Circuit packages of the DIP type have leads that are for insertion into holes in a circuit board for purposes of making electrical connections, whereas circuit packages of the surface-mounted type are designed, as the name implies, for electrical connection to the surface of a circuit board. Circuit packages of the surface-mounted type are normally rectangular and have leads on two or all four sides.

For mounting packages of the surface-mounted type to a circuit board, solder paste is silk-screened onto the minute solder pads that are precisely located on the board to match the pattern or "footprint" of properly aligned leads on the circuit package. After the desired number of circuit packages are placed on the board with the package leads embedded in the solder paste on the pads, the packages are permanently soldered into place. To achieve satisfactory electrical connections on circuit boards using surface-mounted packages, not only must the lead patterns of the packages match the pattern of pads on a circuit board but, also, the contact ends of the leads of a circuit package must all lie substantially in a common plane. This latter condition is often expressed by saying the contact ends of leads of surface-mounted packages must be substantially coplanar. Typically, specifications for surface-mounted packages have required that the contact ends of leads are coplanar within less than about two to about four thousandths of an inch (mils).

As used above in connection with circuit packages of the surface-mounted type, the term "contact end" refers to the portion of a package lead which does, or is intended to, contact a solder pad on a circuit board when the leads are properly aligned (e.g., not bent) and when the package is placed in its normal position. Equivalently, the term "contact end" can be understood to refer to the portion of a circuit package lead which is closest to a flat reference surface when the circuit package rests in its normal position on the reference surface. It should be noted that the actual end of a lead can be significantly different from the contact end, since leads of surface-mounted packages can have various shapes including "J" and gull-wing like shapes. It should also be noted that, when a circuit package is viewed from the side, the contact end of a lead appears to have an edge; such an edge will be referred to herein as an "apparent edge".

Currently, several methods are used for detecting whether the contact ends of leads on surface-mounted circuit packages are coplanar. The conventional detection methods include reflected image comparisons, image analysis employing video cameras, transmitted light measurements, laser-based dimensional measurements, and cast-shadow analysis. As will be discussed below, each of these inspection methods has substantial drawbacks.

The first inspection method, reflected image comparison, is performed with the aid of optical microscopes. Typically in this method, a circuit package is rested on a reflecting surface with the contact ends of the leads supporting the package. Using a microscope at a viewing angle close to parallel to the reflecting surface, each contact end and its reflected image are inspected. When so viewed, the apparent gap between the contact end of a lead and its reflected image is twice the actual gap. To detect whether leads of a surface-mounted circuit package are coplanar by the method of reflected image comparisons, all of the gaps at the contact ends of the leads are measured and then compared. Such manual measurements may require up to several minutes per package, depending upon the number of leads on a package.

It is also known to use video cameras in systems that inspect the leads on circuit packages. In this context, the term video camera refers to cameras that depict a scene in two dimensions. The use of a video camera in an automatic inspection system for inspecting rows of pins on integrated circuit packages of the DIP type is described in U.S. Pat. No. 4,696,047. In the patented inspection system, a conveyor moves the DIP packages past a video camera which provides two-dimensional images of the pins. The images are analyzed by a signal processor which compares the images with a reference stored in the memory of a digital computer. Based upon the image comparisons, the inspection system rejects circuit packages whose pins do not meet specified tolerances.

Also, U.S. Pat. No. 4,668,939 discloses an automated system using a video camera for inspecting solder bumps on chip carriers. According to the patent, the images provided by the video camera are processed to provide one-dimensional intensity plots. The patent states that the intensity plots can be analyzed to detect missing, bridged or excessive solder bumps.

Image analysis employing conventional video cameras has several disadvantages. One difficulty arises from the fact that conventional cameras provide two-dimensional video information which is arranged in rectangular rasters, typically having aspect ratios of about 4:3. By way of contrast, the region of interest when inspecting leads of circuit packages of the surface-mounted type can be, for example, about two-thousand mils wide by twenty mils high, which equates to an aspect ratio of about 100:1. (In this example, the two-thousand mil dimension would represent the length of a surface-mounted package, and the twenty mil dimension would represent the area of interest for encompassing the space between the contact end of a lead and the reference surface.)

To increase aspect ratios when inspecting leads on circuit packages of the surface-mounted type with a video camera, the camera can be fitted with a cylindrical lens that provides image magnification in the vertical direction greater than in the horizontal direction. The purpose of such differential magnification is to increase picture element resolution in the vertical direction while retaining sufficient horizontal field width to allow viewing of an entire side of a circuit package. (As to picture element resolution, it may be noted that video cameras that operate according to conventional television standards, for example, provide about five-hundred elements both horizontally and vertically, for a total of about 250,000 elements in a two-dimensional scene.) Even with cylindrical lenses, however, conventional video cameras may not provide adequate resolution in both the vertical and horizontal dimensions for inspection of the leads of circuit packages of the surface-mounted type.

In a somewhat different technique for inspecting leads on surface-mounted circuit packages, fiber-optic sensors have been used to make so-called "transmitted light" measurements. According to this technique, when a circuit package stands on its leads on a planar surface, a gap between the contact end of a lead and the planar surface can be considered to be analogous to a gate. By this analogy, the quantity of light transmitted through a given gate is directly proportional to the opening provided by the gate, which is to say that the transmitted light is proportional to the gap between the contact end of an inspected lead and the reference surface. By measuring the light intensity at the gap for each lead, one can determine the extend to which the contact ends of the leads of a circuit package are coplanar.

One drawback of transmitted light measurements, however, is that a complete sensor head must be custom designed and fabricated for each package configuration and the conversion of the system from one package type to another is difficult and time-consuming. Another drawback of transmitted light measurement is that such measurements of leads of circuit packages of the surface-mounted type can vary depending upon whether the apparent edges at the contact ends of the leads are horizontal or angled from horizontal. When the contact ends of leads have substantially angled edges, measurements of transmitted light intensity indicates the average distance from a contact end to the reference surface. It should be understood that such average measurements are usually of limited value in determining whether the contact end of a lead will, in fact, adequately contact a solder pad on a circuit board.

It is also known to use laser beams in systems that detect whether the contact ends of leads on surface-mounted circuit packages are coplanar. In typical laser-based systems, a laser beam is directed against a mirror which rotates so that the reflected beam scans across a plane. When a surface-mounted circuit package is stationarily positioned with its leads directed upward, a succession of such laser-based scans at different elevations can provide a profile of the contact ends of the leads. A major disadvantage of using lasers to measure the elevations of the contact ends of leads on circuit packages, however, is that leads with sloping surfaces may not predictably reflect light.

In making measurements of leads on surface-mounted packages by the shadow casting technique, a light source casts shadows of the leads onto an optically flat surface. Then, a photosensor samples the intensity of light at points adjacent to and within the penumbra of each lead shadow to measure the length of the shadow of each lead. Based upon comparisons between the actual and theoretically-expected shadow lengths, the actual location of the contact ends of leads can be inferred. Shadow casting measurements are not always acceptable, however, because they are less accurate than direct measurements of lead dimensions.

OBJECTS AND SUMMARY OF THE INVENTION

The primary object of the present invention is to provide improvements in systems and methods for inspecting leads on circuit packages of the surface-mounted type.

More particularly, an object of the present invention is to provide systems and methods for inspecting leads on circuit packages of the surface-mounted type to detect and measure geometrical properties of the leads. Measurements of the geometry of leads of circuit packages of the surface-mounted type can include, but are not limited to, measurements of the width of leads, the distance center-to-center between leads, the spacing distance edge-to-edge between leads, and determinations of the extent to which the contact ends of the leads are coplanar.

In one embodiment of a method according to the present invention, a circuit package of the surface-mounted type is positioned on a horizontal surface, illumination is provided to silhouette the contact ends of the leads of the package, a vertically-arranged linear array of photosensitive elements is moved horizontally parallel to the reference surface to provide a series of one-dimensional scans vertically along the leads, the horizontal position of the linear array is detected, and signal information obtained from the linear array is processed to detect geometrical properties of the inspected leads.

In the preferred embodiment of a system according to the present invention, there is provided the following elements: a planar horizontal surface for supporting a circuit package for inspection; reference means for providing a generally horizontal reference edge parallel to the surface; illumination means for providing silhouettes of the contact ends of the package leads; a linear array of photosensitive elements mounted to extend vertically and connected to provide, for each of the leads of the package under inspection, signal information indicating a one-dimensional scan of the distance between the contact end of the lead and the reference edge; means for moving the linear array relative to the support means; means for determining the horizontal position of the array; and means for analyzing the signal information provided by the linear array to measure geometrical properties for each lead on a side of an inspected package. The measured geometrical properties can include, for example, vertical distance between the reference edge and the contact end of an inspected lead, center-to-center distance between leads and edge-to-edge spacing between leads.

One advantage of the present invention is that leads on circuit packages of the surface-mounted type can be rapidly inspected with very high resolution.

Another advantage of the present invention is that circuit packages of the surface-mounted type having a variety of sizes, shapes and lead types can be inspected easily without substantial modifications to the measurement system and without substantial changes in measurement accuracy.

Additional advantages of the present invention can be ascertained by reference to the following description and attached drawing which illustrate the preferred embodiment.

BRIEF DESCRIPTION OF THE DRAWING

In the drawing:

FIG. 1 is a diagram which schematically shows, in perspective, an inspection system according to the present invention.

DETAILED DESCRIPTION OF THE PREFERRED EMBODIMENT

In FIG. 1, an electro-optical system 11 is provided to detect geometrical properties of the leads 15 of a circuit package 16 of the surface-mounted type. Included in the system is a reference surface 18 which is horizontally flat to support the contact ends of the leads 15. It should be noted that reference surface 18 has sharp linear edges 19 which lie in the plane of the surface. In the preferred embodiment, reference surface 18 is selectively rotatable in the horizontal plane in steps of ninety degrees. Mechanisms for providing such step-wise rotation are conventional and, for that reason, are not shown.

In the illustrated embodiment, reference surface 18 has a central rectangular aperture 20 whose size and shape depends upon the dimensions of the circuit package 16 under inspection. Preferably, the aperture should be as large as possible while still permitting reference surface 18 to have substantial area to support the contact ends of leads 15. The purpose of the aperture is to allow light to pass upwardly toward the bottom of circuit package 16.

As further shown in FIG. 1, a reflector member 23 is mounted above aperture 20 and an illumination source 24 is provided below the aperture. The illumination source 24 can be, for example, a conventional high-intensity lamp 25 with a focusing lens 26. The lamp 25 and focusing lens 26 are positioned to direct light upward through aperture 20 onto reflector member 23. In practice, the lateral sides of reflector member 23 are angled sufficiently to reflect light from source 24 against the back surfaces of leads 15. As a result, leads 15 are silhouetted when circuit package 16 is viewed from the side.

Further in system 11, an array 31 of photosensitive elements is mounted adjacent reference surface 18. It should be noted that the array is vertically-arranged and extends perpendicularly to reference surface 18. A lens 32 is interposed between the array and the package to focus the individual leads 15 and reference edge 19 onto the photosensitive array.

A mechanism, generally indicated by the bracket 35, is provided to carry array 31 and lens 32 parallel to an edge 19 of reference surface 18. The carrying mechanism 35 can have various configurations. In the illustrated embodiment, for example, carrying mechanism 35 includes a rail member 36 which extends parallel to reference edge 19, a carriage member 37 mounted to travel on rail 36, a driven cam, and a linkage member 39 which connects between cam 38 and carriage 37. In the preferred embodiment, illumination source 24 is also mounted to carriage 37 to travel with photosensitive array 31.

In practice, photosensitive array 31 comprises a linear array of photo-electric transducers such as photodiodes or other photosensitive elements. (The term "linear" refers to the fact that photosensitive elements in the array are arranged in a generally straight line.) Preferably, the photosensitive elements in array 31 number at least several hundred; in one suitable configuration, for example, array 31 contains 1024 photodiodes. Linear photosensitive arrays are commercially available from, for example, the Reticon Corporation of Sunnyvale, Calif.

It should be noted that a linear array of photosensitive elements is sometimes referred to as a "linescan camera". A linescan camera comprised of photodiodes is disclosed, for example, in U.S. Pat. No. 3,781,467. According to this patent, the linescan camera is included in a system which, in conjunction with a microscope, measures the length of non-metallic inclusions in polished steel specimens. Also, linescan cameras are disclosed in U.S. Pat. No. 4,520,702 which is directed to an apparatus for inspecting and cutting articles.

As further shown in FIG. 1, a conductor 48 is provided to carry output signals from linear array 31 to an analog-to-digital converter 49. Such converters are conventional and, as such, operate to convert analog signals to digital signals. As also shown in FIG. 1, a conductor 50 carries digital signals from analog-to-digital converter 49 to a microcomputer 61.

A linear position encoder 51 is connected to carriage 37 to detect the position of array 31 along reference edge 19. Such position encoders, sometimes known as linear motion potentiometers, are well known. From linear position encoder 51, electrical output signals are carried on conductor 52 to microcomputer 61. As will be explained in detail below, microcomputer 61 is conventional and is programmed to use electrical signals from array 31 and encoder 51 to measure selected geometrical properties of leads 15.

OPERATION

To measure geometrical properties of the leads of circuit packages of the surface-mounted type, the first step in operation of system 11 of FIG. 1 is to position a circuit package 16 such that it is stationarily supported on reference surface 18 by the contact ends of its leads 15. Normally, not all of the leads 15 will touch reference surface 18 and, in fact, package 16 normally is supported on the contact ends of only three leads. With a circuit package 16 properly positioned, illumination source 24 projects light onto reflector member 23 which, in turn, reflects light toward the back surfaces of leads 15. (In this context, the terms "front" and "back" indicate the surfaces of leads 15 relative to photosensitive array 31.) With such illumination, the leads are silhouetted, reference edge 19 appears dark, and any space between the reference edge and the contact ends of the leads appears light.

With illumination source 24 providing a concentrated beam of light to silhouette leads 15, cam 38 is rotated to drive carrying mechanism 35 to travel back-and-forth parallel to reference edge 19 along one side of circuit package 16. That is, when cam 38 is driven to rotate about its axis, carriage 37 is forced (by linkage member 39) to reciprocate back-and-forth on rail 36 parallel to reference edge 19.

Further in operation of system 11, array 31 is operated, in effect, to sequentially scan the intensity of light over short vertical distances along the inspected leads 15. Normally, the scanned distance includes the space between the contact end of a lead 15 and edge 19 of reference surface 18; however, the scanned distance can include the entire distance from a reference surface 18 to the bottom surface of circuit package 16. In operation of linear array 31, light which is incident upon the photosensitive elements in the array is converted to voltage. Normally the amplitude of voltage provided by each element in array 31 is proportional, usually substantially linearly, to the intensity of the received light. Thus, output signals from the photosensitive elements in array 31 represent a vertical series of light intensity values in analog form. Those analog signals from the photosensitive elements of array 31 are sent to analog-to-digital converter 59 which converts the analog signals to a digital form.

After conversion, the digital signals are provided to microcomputer 61. Generally speaking, microcomputer 61 analyzes information in the digital signals to identify changes in the light intensity values along linear array 31. More particularly, microcomputer 61 detects the number of photosensitive elements which are relatively brightly illuminated at the sampling or scanning time and, thereby, derives a measure of the vertical distance between silhouetted surfaces, such as between the contact end of a lead 15 and reference surface 18. For example, if ninety photosensitive elements are relatively brightly illuminated in array 31 and the calibrated vertical resolution across the array is ten photosensitive elements per mil, the distance between two silhouetted surfaces can be calculated to be nine mils. From such measures, one can determine, for example, the extent to which the ends of leads 15 of an inspected circuit package 16 are coplanar within preselected limits relative to reference surface 18.

As array 31 travels horizontally relative to reference edge 19, the position of the array is detected by linear encoder 51 and the position information is transmitted to microcomputer 61 by conductor 52. Microcomputer 61 also controllably determines the number of samples (i.e., scans) per lead. Normally, the times at which samples are taken depends on the travel distance indicated by linear encoder 51. Micro-computer 61 also controls movement of carrying mechanism 35 by, for example, controlling the rotation of cam 38.

A simplified example will illustrate operation of microcomputer 61 to measure geometrical properties of leads 15. In this example, it should be assumed tht the contact end of a lead 15 and a reference edge 19 are focused onto array 31. Also for purposes of the example, it should be assumed that three vertical samples (i.e., scans) are made during the time that linear array 31 travels from left to right across the lead. During the first sample, it might be determined that the light intensity along array 31 changes most between the fifth and eighth photosensitive elements as counted from the top of the array. During the second sample, it might be determined that light intensity changes most between the sixth and ninth elements in the array. Finally, during the third sample, it might be determined that the light intensity changes most between the eighth and tenth elements in the array. Based upon the information provided by the samples in this example, one could conclude that the contact end of the lead slopes downward from left to right. In practice, a large number of samples are taken per each lead and the obtained information is used to detect and measure geometrical properties of the inspected leads.

Further in system 11 of FIG. 1, after inspection of the leads on one side of circuit package 16, reference surface 18 is rotated ninety degrees in the horizontal plane and the inspection process is repeated for any leads on the end of package 16. Then, after all leads on the sides of the circuit package are inspected, calculations can be made to determine the distance that any given lead deviates from the plane of reference surface 18 and, thus, to determine the extent to which the contact ends of the leads 15 are coplanar.

In addition to detecting the extent to which leads 15 lie in a common plane, system 11 can detect geometrical properties such as the width of each lead, the center-to-center distances between leads, and the edge-to-edge spacings between leads. System 11 can also be used to detect stand-off dimensions. (The term "stand-off" refers to the minimum distance between the bottom of a circuit package and reference surface 18.)

In practice, once it is determined that vertical scans by array 31 are being taken between leads, data processing can be minimized. This can be accomplished, for example, by reducing the sampling frequency for between-lead scans or, alternatively, by discarding information obtained from between-lead scans. Such techniques are important for minimizing the data processing required of the system and also for increasing the rated inspection speed of the system.

At this juncture, it can be appreciated that the system of FIG. 1 permits optical resolution to be modified independently in the vertical and horizontal directions. In the horizontal direction, optical resolution is conveniently changed by increasing the frequency of vertical scans as array 31 travels. Alternatively, resolution could be increased by slowing the rate of horizontal travel of array 31 at a constant sampling frequency; however, it is usually more convenient to electronically adjust the sampling rate than to mechanically alter the horizontal travel rate. In either case, the effect is essentially to increase the number of vertical scans over a given horizontal distance and, thereby, to increase pixel density (i.e., resolution) in the horizontal dimension. Again, it should be noted that such changes in horizontal resolution can be made without affecting resolution in the vertical direction.

In the vertical dimension, optical resolution is determined by the number of photosensitive elements comprising array 31 and by the focusing optics (i.e., lens 32). If it is assured that a given area of a lead 15 is focused onto all of the photosensitive elements in array 31, then resolution in the vertical direction is determined by the number of elements in the arrays. For example, if a distance of ten mils along a lead 15 is focused across all of the photosensitive elements of linear array 31 having one hundred photosensitive elements, the vertical resolution will be ten pixels per mil. As another example, if the same ten mil distance is focused across twenty photosensitive elements in array 31, the vertical resolution will be two pixels per mil. Again, it should be noted that changes in vertical resolution can be made without affecting horizontal resolution.

Although the present invention has been described in its preferred embodiment, those skilled in the art will appreciate that variations may be made without departing from the spirit and scope of the invention as defined in the appended claims and equivalents. For example, although the foregoing description has emphasized horizontal movement of linear array 31 relative to a stationary reference surface 18, the array could be held stationary and the reference surface could be moved thereby carrying a circuit package past the linear array for inspection.

As another example of an alternative, it can be understood that system 11 can include more than one linear array. For example, four linear arrays can be provided with each array positioned to face a different one of the sides of circuit package 16. In operation of such a four-array system, each array could be positioned initially at one corner of package 16 and then transported completely across a side of the package.

As yet another equivalent alternative, it can be noted that illumination source 24 can be stationary rather than movable. In such an embodiment, lamp 25 would normally be selected to provide flood-type lighting rather than a concentrated beam.

Still further as to another embodiment relating to lighting, it should be appreciated that leads 15 could be illuminated by front lighting rather than back (i.e., silhouette) lighting as long as the illumination produced sharp optical contrast at the edges and contact ends of the leads. According to this alternative, reflector member 23 can be eliminated.

In still another alternative within the scope of the appended claims, the positions of linear array 31 and illuminator source 24 can be interchanged. That is, source 24 would be mounted to illuminate the front sides of leads 15 and linear array 31 would be positioned to view images of silhouettes of the leads reflected from reflector member 23.

In yet another equivalent alternative, with the positions of linear array 31 and illuminator source 24 interchanged, an additional illuminator source could be placed on the opposite side of package 16 and connected to traveling stage 35. In this embodiment, a conventional image splitter would replace reflector 23 and the array 31 would be set up to view leads on both sides of package 16.

What is claimed is:

1. A process for inspecting leads on circuit packages of the surface-mounted type, comprising the steps of:
    positioning a circuit package for inspection on a generally horizontal reference surface having a reference edge that parallels the surface;
    providing illumination of the package leads to produce sharp-contrast at the edges and contact ends of the leads;
    moving a vertically-arranged linear array of photosensitive elements parallel to the reference edge;
    operating the array of photosensitive elements to provide a series of one-dimensional optical samples vertically along the leads; and
    analyzing signal information obtained from the optical samples to detect and measure selected geometrical properties of the inspected leads.

2. A process according to claim 1 wherein the signal information is analyzed to measure the vertical distance between the reference edge and the contact end of each lead.

3. A process according to claim 2 wherein vertical samples are taken for leads on all sides of the package, and the signal information is analyzed to measure the extent to which the contact ends of the leads of the package are coplanar within preselected limits.

4. A process according to claim 1 wherein silhouettes of the package leads are produced by casting light onto the backs of the leads.

5. A process according to claim 1 including the step of focusing images of the contact ends of leads onto the vertically-arranged array.

6. A process according to claim 1 including the steps of detecting horizontal movement of the vertical array along the referenced edge, providing position identifying signals that represent the location of the moving array, and employing the position-identifying signal information to provide selected measures of the geometry of the inspected contact ends of the leads.

7. A process according to claim 1 wherein the signal information is analyzed to measure the extent to which, within preselected limits, the contact ends of the leads deviate from the plane of the reference surface.

8. A process according to claim 1 wherein the signal information is analyzed to measure center-to-center distances between leads.

9. A process according to claim 1 wherein the signal information is analyzed to measure edge-to-edge spacings between leads.

10. A process according to claim 1 wherein the signal information is analyzed to measure stand-off of the circuit package relative to the reference surface.

11. A process for inspecting leads on circuit packages of the surface-mounted type comprising the steps of:
    positioning a circuit package for inspection on a generally horizontal reference surface having a reference edge that parallels the surface;
    moving a vertically-arranged linear array of photosensitive elements parallel to the reference edge;
    operating the photosensitive elements of the linear array to provide a series of one-dimensional optical samples vertically along the leads;
    analyzing signal information provided by the vertical samples to measure selected geometrical properties of the inspected leads.

12. A process according to claim 11 including the steps of detecting horizontal movement of the vertical array along the reference edge, providing position-identifying signals that represent the location of the moving array, and employing the position-identifying signal information to measure geometrical properties of the contract ends of the leads.

13. A process according to claim 11 wherein silhouettes of the package leads are produced by casting light onto the backs of the leads and the photosensitive elements are operated to detect outlines provided by the silhouettes.

14. A process according to claim 12 wherein the position-identifying signal information is analyzed to measure the vertical distance between the reference edge and the contact end of each lead.

15. A process according to claim 14 wherein the position-identifying signal information is analyzed to determine the spacing between leads.

16. A process for inspecting leads on circuit packages of the surface-mounted type, comprising the steps of:
    positioning a circuit package for inspection on a generally horizontal surface having a reference edge that parallels the surface;
    providing illumination to silhouette the package leads so as to produce high-contrast at the edges and contact ends of the leads;
    moving a vertically-arranged linear array of photosensitive elements parallel to the reference edge, and detecting the position of the moving array;
    operating the array of photosensitive elements to provide a series of one-dimensional sample scans vertically along the inspected leads; and
    analyzing the signal information obtained from the vertical sample scans and the information as to the detected position of the array to measure selected geometrical properties of the inspected leads.

17. A system for inspecting leads on circuit packages of the surface-mounted type comprising:

support means for providing a surface for supporting a circuit package for inspection;

reference means for providing a generally horizontal reference edge parallel to the surface;

illumination means for silhouetting contact ends of the package leads;

a linear array of photosensitive elements mounted to extend vertically and positioned to provide one-dimensional vertical scans of the leads of the package under inspection;

carrying means for moving the linear array horizontally relative to the support means; and means for analyzing the signal information provided by the photosensitive elements of the linear array during a series of the one-dimensional scans to provide selected information as to geometrical properties of the inspected leads.

18. A system according to claim 17 wherein the linear array is positioned to measure the vertical distances between the reference edge and the contact ends of inspected leads.

19. A system according to claim 17 wherein the carrying means carries both the illumination means and the linear array parallel to the reference edge.

20. A system according to claim 19 further including focusing means for optically focusing silhouetted images of the inspected leads onto the linear array.

21. A system according to claim 20 wherein the focusing means is mounted to travel with the carrying means.

22. A system according to claim 17 further including location detecting means for detecting the location of the moving array along the reference edge.

23. A system according to claim 22 wherein the means for analyzing information employs signals from the location detecting means and from the photosensitive elements to measure the distance between the contact end of each lead and the reference edge.

24. A system for inspecting leads on circuit packages of the surface-mounted type comprising:

support means for providing a reference surface for supporting a circuit package for inspection;

reference means for providing a generally horizontal reference edge parallel to the reference surface;

a linear array of photosensitive elements mounted to extend vertically and connected to provide first signal information indicating a one-dimensional scan of a lead relative to the reference edge;

carrying means for moving the linear array parallel to the reference edge while providing second signal information relating to the position of the array of photosensitive elements horizontally along the reference edge; and means for analyzing the first signal information provided by the linear array and the second signal information provided by the carrying means to provide output signals which indicate selected geometrical properties of the leads. means to detect selected geometrical properties of the leads.

25. A system according to claim 24 further including illumination means for providing silhouettes of the contact ends of the package leads.

26. A system according to claim 25 wherein the illumination means includes a reflector mounted to the support means to reflect light onto the back surfaces of the package leads.

27. A system according to claim 26 wherein the support means has an aperture formed therein to receive light which is reflected by the reflector means.

28. A system according to claim 25 wherein the carrying means is connected to carry both the illumination means and the linear array of photosensitive elements parallel to the reference edge.

29. A system according to claim 24 wherein the means for analyzing information employs signals from the carrying means and from the photosensitive elements to measure the distances, if any, between the contact ends of inspected leads and the reference edge.

* * * * *